United States Patent
Abedinpour et al.

(10) Patent No.: US 7,372,333 B2
(45) Date of Patent: May 13, 2008

(54) MONOLITHIC SUPPLY-MODULATED RF POWER AMPLIFIER AND DC-DC POWER CONVERTER IC

(75) Inventors: Siamak Abedinpour, Scottsdale, AZ (US); Sayfe Kiaei, Fountain Hills, AZ (US)

(73) Assignee: Arizona Board of Regents, acting for and on behalf of Arizona State University, Tempe, AZ (US)

( * ) Notice: Subject to any disclaimer, the term of this patent is extended or adjusted under 35 U.S.C. 154(b) by 125 days.

(21) Appl. No.: 10/544,408

(22) PCT Filed: Feb. 3, 2004

(86) PCT No.: PCT/US2004/003161

§ 371 (c)(1),
(2), (4) Date: Apr. 7, 2006

(87) PCT Pub. No.: WO2004/070941

PCT Pub. Date: Aug. 19, 2004

(65) Prior Publication Data

US 2006/0226909 A1    Oct. 12, 2006

(51) Int. Cl.
*H03F 3/04* (2006.01)
(52) U.S. Cl. .............. 330/297; 330/267; 330/251; 330/207 A
(58) Field of Classification Search .............. 330/297, 330/267, 251, 207 A
See application file for complete search history.

(56) References Cited

U.S. PATENT DOCUMENTS

| | | | |
|---|---|---|---|
| 6,138,042 A * | 10/2000 | Midya et al. | ............... 455/571 |
| 6,300,826 B1 | 10/2001 | Mathe et al. | |
| 6,492,867 B2 | 12/2002 | Bar-David | |
| 6,583,664 B2 * | 6/2003 | Mathe et al. | ................. 330/10 |
| 6,781,452 B2 * | 8/2004 | Cioffi et al. | .................. 330/10 |
| 6,791,298 B2 | 9/2004 | Shenai et al. | |
| 6,813,319 B1 * | 11/2004 | Nagle et al. | ................ 375/302 |
| 7,026,797 B2 * | 4/2006 | McCune, Jr. | ............... 323/225 |
| 2003/0090237 A1 | 5/2003 | Shenai et al. | |

(Continued)

FOREIGN PATENT DOCUMENTS

WO    WO 01/97479 A1    12/2001

(Continued)

OTHER PUBLICATIONS

Abedinpour S. et al., "DC-DC power converter for monolithic implementation," IEEE Industry Applications Conference (IAS), 2000, pp. 2471-2475.

(Continued)

*Primary Examiner*—Patricia Nguyen
(74) *Attorney, Agent, or Firm*—McDonnell Boehnen Hulbert & Berghoff LLP

(57) ABSTRACT

Embodiments of RF power amplifiers are disclosed that include switched-mode power amplifiers supplied by synchronous buck DC-DC converters. The switched-mode power amplifiers can be used to amplify a limited form of an RF input signal and the supply to the switched-mode power amplifier is varied in response to the envelope of the RF input signal. One embodiment includes a switched-mode power amplifier connected to a synchronous buck DC-DC converter.

10 Claims, 4 Drawing Sheets

U.S. PATENT DOCUMENTS

| | | |
|---|---|---|
| 2003/0090244 A1 | 5/2003 | Shenai et al. |
| 2003/0090245 A1 | 5/2003 | Shenai et al. |
| 2003/0090246 A1 | 5/2003 | Shenai et al. |
| 2006/0091871 A1 | 5/2006 | Abedinpour et al. |

FOREIGN PATENT DOCUMENTS

| | | |
|---|---|---|
| WO | WO 03/041238 | 5/2003 |
| WO | WO 03/041250 | 5/2003 |
| WO | WO 03/041252 | 5/2003 |
| WO | WO 03/100831 | 12/2003 |

OTHER PUBLICATIONS

Abedinpour S. et al., Integrated ZVS synchronous buck DC-DC converter with adaptive control for improved ZVS performance. www.azte.com/documents/wireless/m2-086.abedinpour.pdf printed Apr. 30, 2007.

Rincon-Mora GA et al., "Optimized frequency-shaping circuit topologies for LDO's," IEEE Trans. Circuits and Systems II: Analog and Digital Signal Processing, 45(6) 1998.

Maksimovic D et al., Proc. "Switched-capacitor DC-DC converters for low-power on-chip applications," IEEE Power Electronics Specialists Conference (PESC), 1999, pp. 54-59.

Lau W et al., Proc. "An integrated controller for a high frequency buck converter," IEEE Power Electronics Specialists Conference (PESC), 1997, pp. 246-254.

Stratakos A et al., Proc. "A low-voltage CMOS DC-DC converter for a portable battery operated system," IEEE Power Electronics Specialists Conference (PESC), 1994, pp. 619-626.

Acker B et al., Proc. "Synchronous rectification with adaptive timing control," IEEE Power Electronics Specialists Conference (PESC), 1995, pp. 88-95.

International Search Report for International Application No. PCT/US2004/003161 dated Jul. 21, 2004 (mailed Oct. 14, 2004) (4 pgs.).

Written Opinion of the International Searching Authority for International Application No. PCT/US2004/003161 mailed Oct. 14, 2004 (3 pgs.).

International Preliminary Examination Report on Patentability for International Application No. PCT/US2004/003161 dated Dec. 16, 2004 (4 pgs.).

* cited by examiner

MONOLITHIC SUPPLY-MODULATED RF POWER AMPLIFIER AND DC-DC POWER CONVERTER IC

BACKGROUND OF THE INVENTION

The present invention relates generally to RF power amplifiers and more specifically to the use of a RF power amplifier including a synchronous buck DC-DC converter supplying power to a switched-mode power amplifier.

Electronic devices requiring use of a battery, such as mobile communications terminals, can achieve increased battery life by using efficient RF power amplifiers. RF power amplifiers typically have high current consumption. Attempts have been made using external circuitry to improve the efficiency of RF power amplifiers located on integrated circuits. However, internal switching frequencies can be orders of magnitude faster than off-chip signals. Therefore, external power supplies and control circuits are often unable to respond rapidly enough to varying load conditions. In addition, the parasitic resistance and inductance of the interconnects between an integrated circuit and external circuitry can reduce the voltage swing of the power amplifier, increase power loss and cause resonance and instability.

SUMMARY OF THE INVENTION

Efficient RF power amplifiers are disclosed that are capable of being integrated. In one aspect of the invention envelope elimination and restoration is used to linearize a switched-mode power amplifier using a feedback controlled synchronous buck DC-DC power supply. One embodiment includes a switched-mode power amplifier supplied by a synchronous buck DC-DC power supply, a controller configured to control the power supplied by the synchronous buck DC-DC power supply and the controller is connected to a feedback loop that is configured to provide the controller with a signal capable of being used by the controller to adjust the level of the voltage supplied by the synchronous buck DC-DC power supply in response to variations in the envelope of the RF input signal.

In a further embodiment, the RF input signal is provided to the input of the switched-mode power amplifier via a limiter, which limits the variation in the level of the RF input signal and the limiter provides the limited RF input signal to a resonant gate drive that is connected to the input of the switched-mode power amplifier. In addition, the feedback includes an envelope detector that receives the RF input signal as an input and provides an output to a comparator, the second input of the comparator is connected to the output of the switched-mode power amplifier by an envelope detector and an attenuator and the output of the comparator is provided to the controller.

In yet another embodiment, the switched-mode power amplifier is a class E RF power amplifier.

A still further embodiment of the invention includes a switched-mode power amplifier connected to a synchronous buck DC-DC converter.

Yet another embodiment of the invention also includes a resonant gate drive connected to an input of the switched-mode power amplifier, a limiter connected to an input of the resonant gate drive, a controller connected to an input of the synchronous buck DC-DC converter, a comparator including an output connected to the controller, a first envelope detector connected to a first input of the comparator and a second envelope connector connected to a second input of the comparator and to an output of the switched-mode power amplifier by an attenuator.

In a still further embodiment again, the switched-mode power amplifier is a class E RF power amplifier.

DETAILED DESCRIPTION OF THE INVENTION

Turning now to the drawings, a radio frequency (RF) power amplifier that is capable of being integrated is illustrated. The RF power amplifier uses envelope elimination and restoration to linearize a switched-mode power amplifier. A synchronous buck DC-DC converter is integrated with the switched-mode power amplifier and provides its supply voltage, while tracking the envelope of the RF input signal. Integrating the synchronous buck DC-DC converter in proximity with the switched-mode power amplifier can reduce parasitic inductance and resistance, increase voltage swing and decrease power loss.

Figure 1:
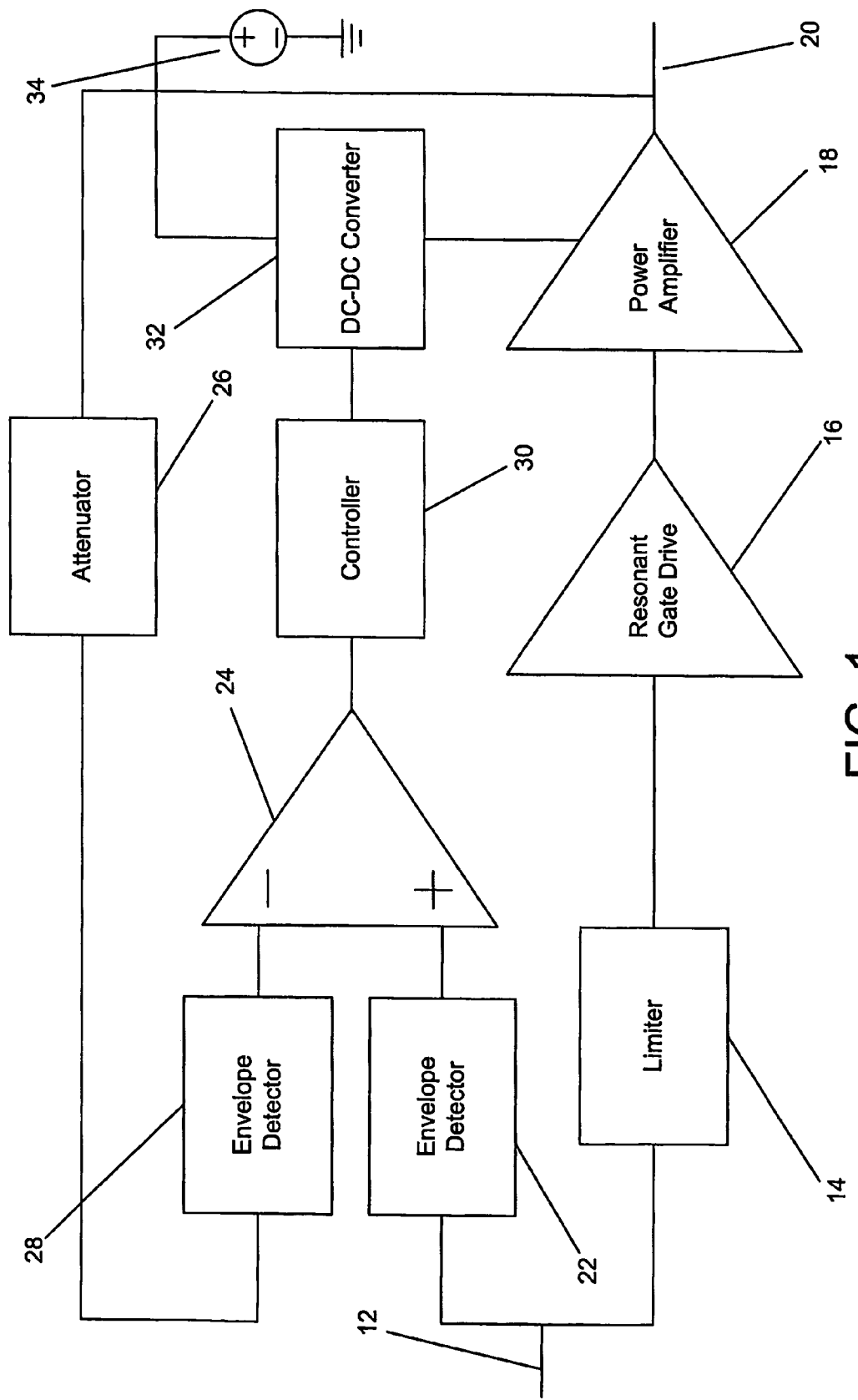
FIG. 1 is a schematic view illustrating a RF power amplifier in accordance with the present invention.

A RF power amplifier in accordance with the present invention is illustrated in FIG. 1. The RF power amplifier 10 includes an input 12. The input is connected to a limiter 14 and the output of the limiter is connected to the input of a resonant gate drive 16. The output of the resonant gate drive is connected to the input of a switched-mode power amplifier 18 and the output of the switched-mode power amplifier is connected to the output 20 of the RF power amplifier. The input 12 of the RF power amplifier is also connected to a first envelope detector 22. The output of the first envelope detector is connected to the non-inverting input of a comparator 24. The inverting input of the comparator is connected to a feedback loop that provides feedback from the output 20 of the RF amplifier. The feedback loop includes an attenuator that is connected between the output 20 of the RF amplifier and the input of a second envelope detector 28. A connection between the output of the second envelope detector and the inverting input of the comparator completes the feedback loop. The output of the comparator is connected to a controller 30. The controller is also connected to a synchronous buck DC-DC converter 32, which provides a supply voltage via a connection to the switched-mode power amplifier. In operation, the synchronous buck DC-DC converter of the RF power amplifier is connected to a power supply such as a battery 34. In one embodiment, all of the components of the RF power amplifier 10 in accordance with the present invention are integrated onto a single integrated circuit. In other embodiments, multiple integrated circuits and/or discrete components can be used in the construction of an RF power amplifier 10 in accordance with the present invention.

In operation, the RF power amplifier 10 receives an RF signal that can include information in the amplitude of the signal and/or the phase of the signal. The limiter 14 that is connected to the input 12 of the RF power amplifier 10 generates an output signal in which the amplitude variations of the input signal are limited. The first envelope detector 22 extracts information concerning the amplitude of the signal. The amplitude limited signal output by the limiter is used by the resonant gate drive 16 to drive the input of a switched-mode power amplifier 18. The power supply of the switched-mode power amplifier varies according to the output of the synchronous buck DC-DC converter. If the power supply of the switched-mode power amplifier was fixed, however, then the output of the switched-mode power amplifier would be an amplified version of the signal provided to the input of the resonant gate drive.

As mentioned above, the supply voltage to the switched-mode power amplifier is not fixed. Instead, the supply voltage varies. In the embodiment illustrated in FIG. 1, the supply voltage of the switched-mode power amplifier is provided by the output of the synchronous buck DC-DC converter 32. If the output voltage of the synchronous buck DC-DC converter increases, then the output amplitude of the switched-mode power amplifier increases. Conversely, a decrease in the output voltage of the synchronous buck DC-DC converter can result in a decrease in the output amplitude of the switched-mode power amplifier. The output voltage supplied by the synchronous buck DC-DC converter varies in response to an input signal provided by the controller 30. The input signal provided by the controller is determined based on the output of the comparator which compares the envelope of the waveform provided to the input 12 of the RF power amplifier with the envelope of an attenuated version of the output of the switched-mode power amplifier. The comparator indicates which of the envelope signals is the greater and the controller uses this information to adjust the output of the synchronous buck DC-DC converter. In one embodiment, the controller accommodates propagation delays and controls the output of the synchronous buck DC-DC converter with the objective of matching the attenuated envelope of the switched-mode power amplifier with the envelope of the waveform provided to the input 12 of the RF power amplifier.

Figure 2:
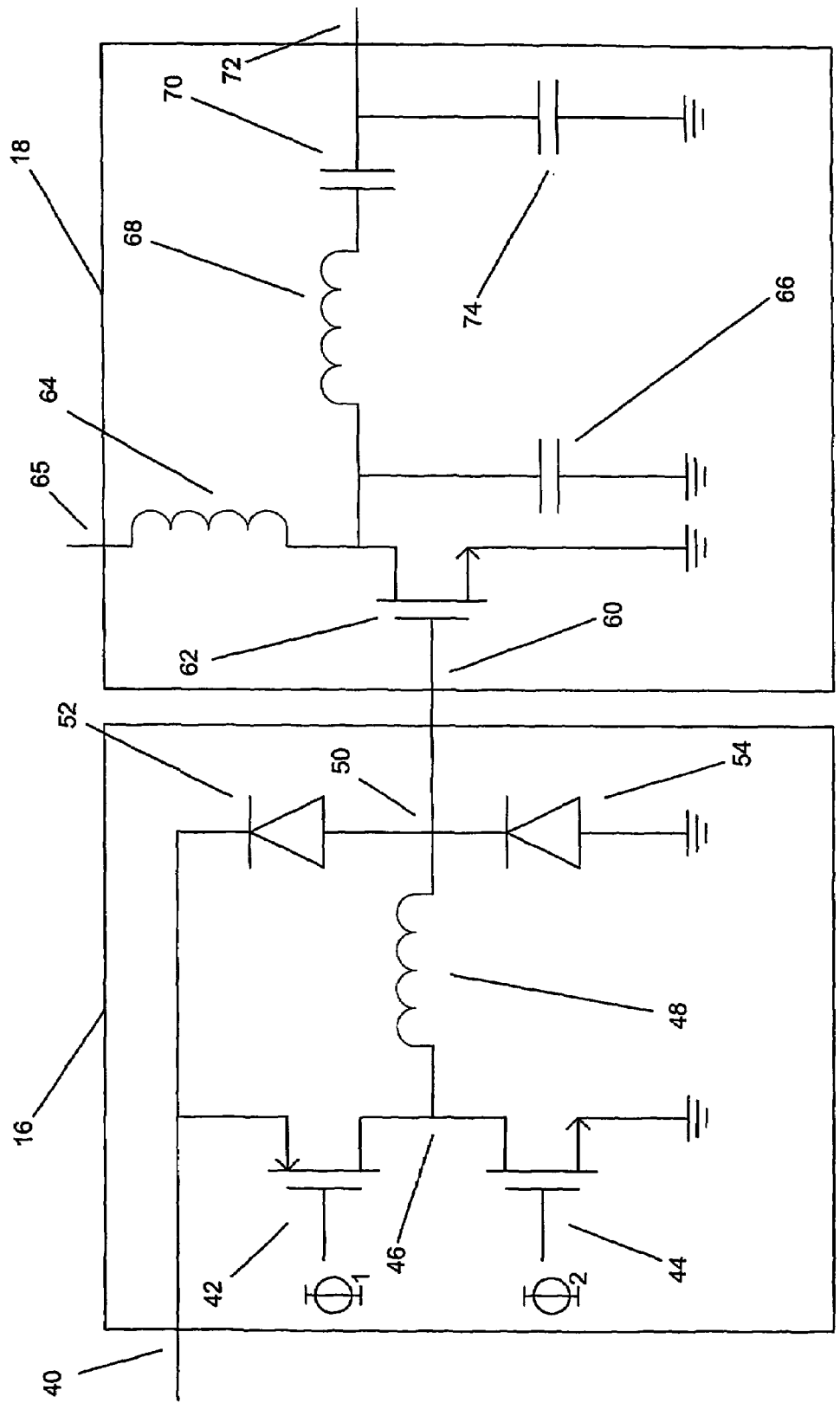
FIG. 2 is a schematic diagram of a resonant gate drive and a power amplifier that can be used in the RF power amplifier in accordance with the present invention.

An embodiment of a resonant gate drive and a class E RF power amplifier that can be used to implement an RF power amplifier in accordance with the present invention are illustrated in FIG. 2. The resonant gate drive 16 is implemented as a monolithic resonant gate drive and includes an input 40 connected to the source of an n-channel MOSFET 42. The drain of the n-channel MOSFET 42 is connected to the drain of a p-channel MOSFET 44. The source of the p-channel MOSFET 44 is connected to ground. The gates of the n-channel and p-channel MOSFETs are connected to reference signals $\Phi_1$ and $\Phi_2$ respectively. A first junction 46 is formed where the drains of the n-channel and p-channel MOSFETS connect. An inductor 48 is connected between the first junction 46 and a second junction 50. A first diode 52 is connected between the source of the n-channel MOSFET 42 and the second junction 50. The first diode is connected so that the forward current flow direction of the first diode is from the second junction 50 to the source of the n-channel MOSFET. A second diode 54 is connected between the second junction 50 and ground. The second diode is connected so that the forward current flow direction of the second diode is from ground to the second junction 50.

The second junction 50 is connected to an input 60 of the class E RF power amplifier 18. The input 60 of the class E RF power amplifier 18 is the gate of a p-channel power MOSFET 62. The drain of the p-channel power MOSFET 62 is connected to one end of a first inductor 64. The other end 65 of the first inductor is configured to be connected to a power supply. The drain of the p-channel power MOSFET is also connected to a first capacitor 66 and a second inductor 68. The first capacitor 66 is connected between the drain of the p-channel power MOSFET and ground. The second inductor 68 is connected between the drain of the p-channel power MOSFET and a second capacitor 70. The second capacitor is also connected to the output 72 of the class E RF power amplifier. A third capacitor 74 is connected between the output of the class E RF power amplifier and ground.

Class E RF power amplifiers are switched-mode power amplifiers that can shape the waveforms of the switch voltage and switch current so that the transitions of those two waveforms are displaced in time from each other. The design of the resonant gate drive can be important as the power MOSFET in the class E RF power amplifier will not operate as intended if its input is not driven properly. In the illustrated embodiment, the resonant gate drive. In other embodiments, other switched-mode power amplifier designs and resonant gate drive circuits can be used in the construction of a RF power amplifier in accordance with the present invention.

Figure 3:
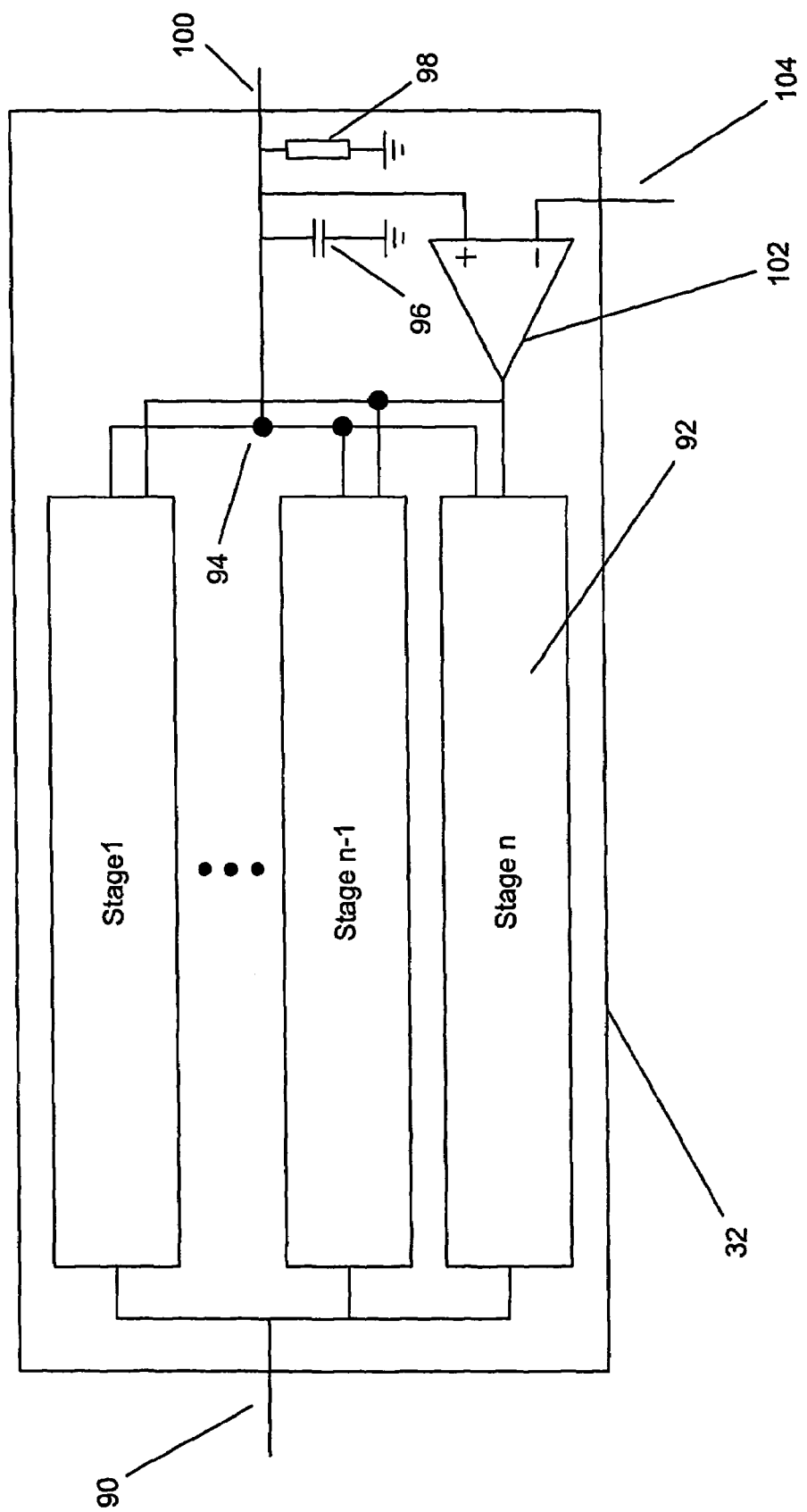
FIG. 3 is a schematic diagram of a synchronous buck DC-DC converter that can be used in the RF power amplifier in accordance with the present invention.

As discussed above, the power supply provided to the switched-mode power amplifier is provided by a synchronous buck DC-DC converter in accordance with the present invention. An embodiment of a synchronous buck DC-DC converter suitable for use in an RF power amplifier in accordance with the present invention is illustrated in FIG. 3. The synchronous buck DC-DC converter 32 includes an input 90 connected to n stages. Each of the stages are connected in parallel to a junction 94. A capacitor 96 and a resistor 98 are both connected between the junction and ground. An output 100 of the synchronous buck DC-DC converter is also connected to the junction 94 and the junction is also connected to the non-inverting input 102 of a comparator. The inverting input 104 of the comparator is configured to be connected to a controller. The output of the comparator is provided as a feedback signal to each of the stages. When a controller is connected to the inverting input of the comparator, the controller is able to control the voltage provided on the output of the synchronous buck DC-DC converter. In the embodiment of the RF power amplifier 10 illustrated in FIG. 1, the controller generates a signal that attempts to enable the output of the synchronous buck DC-DC converter to follow the envelope of the RF signal at the input 12 of the RF power amplifier.

Figure 4:
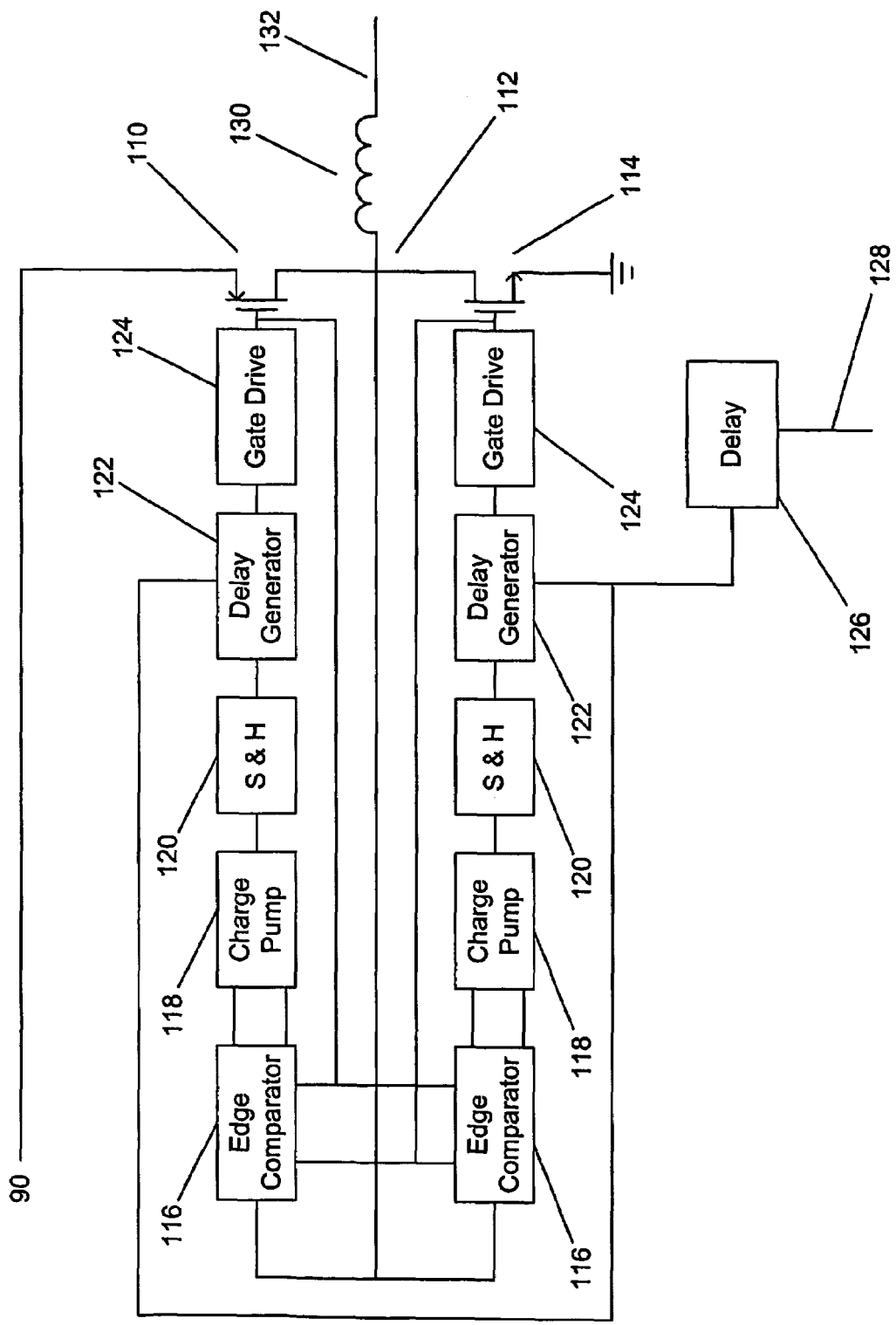
FIG. 4 is a schematic diagram of a stage that can be used to implement a stage of the synchronous buck DC-DC converter illustrated in FIG. 3.

An embodiment of an implementation of one of the stages shown in FIG. 3 in accordance with the present invention is illustrated in FIG. 4. The input 90 of the synchronous buck DC-DC converter is connected to the source of an n-channel MOSFET 110. The drain of the n-channel MOSFET 110 is connected to a junction 112. The drain of a p-channel MOSFET 114 is also connected to the junction and the source of the p-channel MOSFET 114 is connected to ground. The gates of each of the MOSFETs are connected to control circuitry. The control circuitry connected to each gate includes an edge comparator 116 connected to a charge pump 118. The charge pumps are connected to sample and hold circuits 120 and the sample and hold circuits are connected to delay generators 122. The delay generators are connected to gate drives 124 and the gate drives are connected to the gates of the MOSFETs. Each of the edge comparators is connected to the junction 112 and to the voltage at the gate of each of the MOSFETs. The delay generators receives a signal from a delay block 126 that is interposed between an input 128 that is configured to receive a signal from the comparator 102 shown in FIG. 3. An inductor 130 is connected between the junction 112 and the stage output 132.

The synchronous buck DC-DC converter illustrated in FIG. 3 uses n stages similar to the stages illustrated in FIG. 4. A delay block in each stage is configured to introduce an approximately 360°/n phase shift between adjacent stages. Each of the stages has control circuitry that can adjust the dead-time between the gate triggering pulses of the power MOSFETs in each stage to attain zero voltage switching operation over a wide range of load variation.

In the embodiment illustrated in FIG. 4, each of the gate drives 124 is configured to provide input signals to the gate of a MOSFET that can drive the MOSFET into linear operation mode or into cut-off mode. The gate drives 124 are controlled to obtain zero voltage switching conditions. Zero voltage switching involves coordinating the switching of the MOSFETs so that the voltage drop across the drain and the source of the MOSFET is approximately zero volts during switching. The closer the voltage across the source and the drain of the MOSFET is to the zero voltage switching condition, the less power that is consumed by the synchronous buck DC-DC converter.

During operation, one of the MOSFETs can be in linear operation and the other in cut-off mode. The edge comparators 116 detect a switch in the gate voltage of the MOSFET, which is in linear operation mode. This switch causes the edge comparator to send a signal to the charge pump 118 associated with the cut-off MOSFET. The sample and hold circuitry 120 connected to this charge pump then holds the voltage level generated by the charge pump. However, this voltage level is not immediately used to drive the gate drive 124. Instead, the delay generator 122 introduces a delay in the propagation of the output from the sample and hold circuitry to the input of the gate drive. The magnitude of the delay is dependent on the output of the comparator 56, which is configured to provide a signal indicative of variations in the load impedance. In one embodiment, the magnitude of the delay is sufficient to ensure that the voltage across the source and the drain of the MOSFET is as close as possible to zero volts at the time the MOSFET switches.

In one embodiment, the synchronous buck DC-DC converter uses two stages similar to the stages illustrated in FIG. 4. In other embodiments, other control circuitry can be used that is designed to attain zero voltage switching of the power MOSFETs used in the stages of the synchronous buck DC-DC converter.

While the above description contains many specific embodiments of the invention, these should not be construed as limitations on the scope of the invention, but rather as an example of one embodiment thereof. Many other variations are possible. Accordingly, the scope of the invention should be determined not by the embodiments illustrated, but by the appended claims and their equivalents.

What is claimed is:

1. A RF power amplifier configured to receive an RF input signal, comprising:
   a switched-mode power amplifier supplied by a synchronous buck DC-DC power supply;
   a controller configured to control the power supplied by the synchronous buck DC-DC power supply;
   wherein the controller is connected to a feedback loop that is configured to provide the controller with a signal capable of being used by the controller to adjust the level of the voltage supplied by the synchronous buck DC-DC power supply in response to variations in the envelope of the RF input signal; and
   wherein the RF input signal is provided to the input of the switched-mode power amplifier via a limiter, which limits the variation in the level of the RF input signal; and
   the limiter provides the limited RF input signal to a resonant gate drive that is connected to the input of the switched-mode power amplifier.

2. The RF power amplifier of claim 1, wherein:
   the feedback includes an envelope detector that receives the RF input signal as an input and provides an output to a comparator;
   the second input of the comparator is connected to the output of the switched-mode power amplifier by an envelope detector and an attenuator; and
   the output of the comparator is provided to the controller.

3. The RF power amplifier of claim 1, wherein the switched-mode power amplifier is a class E RF power amplifier.

4. A RF power amplifier, comprising a switched-mode power amplifier connected to a synchronous buck DC-DC converter, and
   a resonant sate drive connected to an input of the switched-mode power amplifier.

5. The RF power amplifier of claim 4, further comprising a limiter connected to an input of the resonant gate drive.

6. The RF power amplifier of claim 4, further comprising a controller connected to an input of the synchronous buck DC-DC converter.

7. The RF power amplifier of claim 6, further comprising:
   a comparator including an output connected to the controller;
   a first envelope detector connected to a first input of the comparator; and
   a second envelope connector connected to a second input of the comparator and to an output of the switched-mode power amplifier by an attenuator.

8. The RF power amplifier of claim 4, wherein the switched-mode power amplifier is a class E RF power amplifier.

9. A RF power amplifier, comprising:
   a switched-mode power amplifier connected to a synchronous buck DC-DC converter;
   a resonant gate drive connected to an input of the switched-mode power amplifier;
   a limiter connected to an input of the resonant gate drive;
   a controller connected to an input of the synchronous buck DC-DC converter;
   a comparator including an output connected to the controller;
   a first envelope detector connected to a first input of the comparator; and
   a second envelope connector connected to a second input of the comparator and to an output of the switched-mode power amplifier by an attenuator.

10. The RF power amplifier of claim 9, wherein the switched-mode power amplifier is a class E RF power amplifier.

* * * * *